United States Patent
Lee

(10) Patent No.: US 8,241,994 B2
(45) Date of Patent: Aug. 14, 2012

(54) METHOD FOR FABRICATING ISOLATION LAYER IN SEMICONDUCTOR DEVICE

(75) Inventor: Jin Yul Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 312 days.

(21) Appl. No.: 12/647,766

(22) Filed: Dec. 28, 2009

(65) Prior Publication Data

US 2011/0027966 A1 Feb. 3, 2011

(30) Foreign Application Priority Data

Jul. 31, 2009 (KR) .................. 10-2009-0070762

(51) Int. Cl.
*H01L 21/76* (2006.01)
(52) U.S. Cl. ................. 438/431; 257/E21.546
(58) Field of Classification Search .......... 438/424, 438/428, 431, 780, 781, 787; 257/E21.546
See application file for complete search history.

(56) References Cited

U.S. PATENT DOCUMENTS

| 7,371,657 | B2 | 5/2008 | Wellhausen et al. |
| 7,413,987 | B2 * | 8/2008 | Hieda et al. ............. 438/691 |
| 7,682,927 | B2 * | 3/2010 | Hoshi et al. ............. 438/424 |
| 7,763,523 | B2 * | 7/2010 | Ahn et al. ............... 438/425 |
| 2009/0142935 | A1 | 6/2009 | Fukuzawa et al. |

FOREIGN PATENT DOCUMENTS

| KR | 10-0866143 | 10/2008 |
| KR | 10-2009-0042423 | 4/2009 |
| KR | 10-2009-0044647 | 5/2009 |
| KR | 10-2009-0077315 | 7/2009 |

* cited by examiner

*Primary Examiner* — Quoc Hoang
(74) *Attorney, Agent, or Firm* — Marshall, Gerstein & Borun LLP

(57) ABSTRACT

A method for fabricating an isolation layer in a semiconductor device, comprising: forming a trench in a semiconductor substrate; forming a flowable insulation layer on the trench and the semiconductor substrate; converting the flowable insulation layer to a silicon oxide layer by implementing a curing process comprising continuously heating the flowable insulation layer; and forming an isolation layer by planarizing the silicon oxide layer.

7 Claims, 6 Drawing Sheets

METHOD FOR FABRICATING ISOLATION LAYER IN SEMICONDUCTOR DEVICE

CROSS-REFERENCE TO RELATED APPLICATION

Priority to Korean patent application number 10-2009-0070762 filed on Jul. 31, 2009, the entire disclosure of which is incorporated by reference in its entirety, is claimed.

BACKGROUND OF THE INVENTION

The invention relates generally to fabrication of a semiconductor device and, more particularly, to a method of fabricating an isolation layer in a semiconductor device.

As the degree of integration of semiconductor devices has increased and the design rule has been reduced, pattern sizes of the semiconductor devices have been miniaturized. Particularly, as device sizes have been reduced to 40 nm technology or below, the importance of an isolation process that adjusts data retention time of semiconductor memory devices, e.g. dynamic random access memory (DRAM) devices to enhance a yield of the device has greatly increased. To enhance the data retention time of semiconductor devices, various process materials for the isolation method have been studied.

Among such isolation methods, a method for fabricating an isolation layer using a shallow trench isolation (STI) process, which has an excellent isolation property, is generally employed. In the STI process, the isolation layer is made by forming a trench with a predetermined depth in a semiconductor substrate and filling the trench with an insulation layer, followed by planarization. Meanwhile, as a critical dimension of the trench is decreased and a depth of the trench is increased with reduction in the device, the importance of selection of material for filling the trench is greatly increased. As the material for filling the trench to form the isolation layer, an oxide layer formed by a high density plasma (HDP) process is commonly employed. However, with the reduction in device sizes to 40 nm technology or less, a limitation in filling of the trench with the oxide layer by the HDP process has been exhibited. Accordingly, a method of filling the trench using a flowable insulation layer formed of a compound in which solvent and solute are mixed has been studied and employed. However, when filling the trench with the flowable insulation layer, various problems are generated according to the stress or shrinkage level of the flowable insulation layer and it is thus difficult to form a high quality insulation layer.

FIGS. 1A and 1B illustrate the problems generated when filling the trench with the flowable insulation layer according to prior practice.

Referring to FIGS. 1A and 1B, when filling the trench formed in a semiconductor substrate 100 with a flowable insulation layer 105, rapid variation in stress occurs in the flowable insulation layer by a subsequent process and this can result in delamination or formation of a crack 110 in the flowable insulation layer 105, particularly in a peripheral region. Also, in a subsequent process after filling the trench with the flowable insulation layer, the flowable insulation layer is shrunk to generate a slip or dislocation 115 (FIG. 1b). A pad layer 120 overlies the region of the slip or dislocation 115.) When these defects are generated, it is difficult to form a uniform, high quality insulation layer.

Accordingly, there is a need for a method for forming an isolation layer capable of ensuring stable device properties and high quality devices.

SUMMARY OF THE INVENTION

In one embodiment, a method for fabricating an isolation layer in a semiconductor device comprises: forming a trench in a semiconductor substrate; forming a flowable insulation layer on the trench and the semiconductor substrate; converting the flowable insulation layer to a silicon oxide layer by a curing process comprising continuously heating the flowable insulation layer; and forming an isolation layer by planarizing the silicon oxide layer.

Preferably, the flowable insulation layer comprises a polysilazane layer.

Preferably, the curing process comprises: placing the semiconductor substrate formed with the flowable insulation layer in a curing apparatus; optionally implementing a first curing step by heating at a low temperature in the range of 300° C. to 400° C. while supplying an oxidant source on the flowable insulation layer to control shrinkage of the flowable insulation layer during heating; implementing a second curing step comprising continuously raising the temperature in the curing apparatus to an increased temperature in the range of 650° C. to 750° C.; optionally implementing a third curing step comprising maintaining the temperature in the curing apparatus at a temperature in the range of 650° C. to 750° C. for a predetermined time to stabilize the flowable insulation layer; implementing a fourth curing step comprising continuously raising the temperature in the curing apparatus to an increased temperature in the range of 830° C. to 1100° C. to induce compressive stress; and implementing a fifth curing step comprising maintaining the temperature in the curing apparatus at a high temperature in the range of 830° C. to 1100° C. for 50 minutes to 70 minutes.

Preferably, hydrogen gas and oxygen gas are supplied together to catalytically form water as the oxidant source, in respective relative amounts of 1 liter to 3 liters and 3 to 5 liters, and additional oxygen gas is separately supplied in a relative amount of 8 liters to 12 liters.

Preferably, the first through fourth curing steps are each implemented at a wet fraction of 12% to 16% while maintaining a pressure in a range of 350 Torr to 450 Torr, and the fifth curing step preferably is implemented at a wet fraction of 35% to 45% while maintaining a pressure in a range of 350 Torr to 400 Torr.

Preferably, the conversion of the flowable insulation layer to the silicon oxide layer is implemented so that the shrinkage of the flowable insulation layer is maintained at a level of 20% or less and the compressive stress has an absolute value of 40 MPa.

Preferably, the first, second, and fourth curing steps are each implemented by varying the wet fraction in a range from 8% to 89% and a pressure in a range of 100 Torr to 700 Torr.

Preferably, in the fourth curing process, temperature, wet fraction and pressure are each varied in respective ranges of 850° C. to 1100° C., 8% to 89%, and 100 Torr to 700 Torr, to adjust the compressive stress.

In another embodiment, a method for fabricating an isolation layer in a semiconductor device comprises: forming a trench in a semiconductor substrate; forming a flowable insulation layer on the trench and the semiconductor substrate; placing the semiconductor substrate formed with the flowable insulation layer in a curing apparatus; optionally implementing a first curing step by heating at a low temperature in a range of 300° C. to 400° C. while supplying an oxidant source on the flowable insulation layer to control shrinkage of the flowable insulation layer during heating; implementing a second curing step comprising continuously raising the temperature in the curing apparatus to an increased temperature in the range of 650° C. to 750° C.; optionally implementing a third curing step comprising maintaining the temperature in the curing apparatus at a temperature in the range of 650° C. to 750° C. for a predetermined time to stabilize the flowable insulation layer; implementing a fourth curing step comprising continuously raising the temperature in the curing apparatus to an increased temperature in the range of 830° C. to 1100° C. to induce compressive stress; and implementing a fifth curing step comprising maintaining the temperature in the curing apparatus at a high temperature in the range of 830° C. to 1100° C. for 50 minutes to 70 minutes to convert the flowable insulation layer to a silicon oxide layer, in which shrinkage of the flowable insulation layer is maintained at a level of 20% or less and the compressive stress has an absolute value of 40 MPa or more; and forming an isolation layer by planarizing the silicon oxide layer.

DESCRIPTION OF SPECIFIC EMBODIMENTS

Preferred embodiments of the invention are described in detail below with reference to the accompanying drawings.

Figure 5:
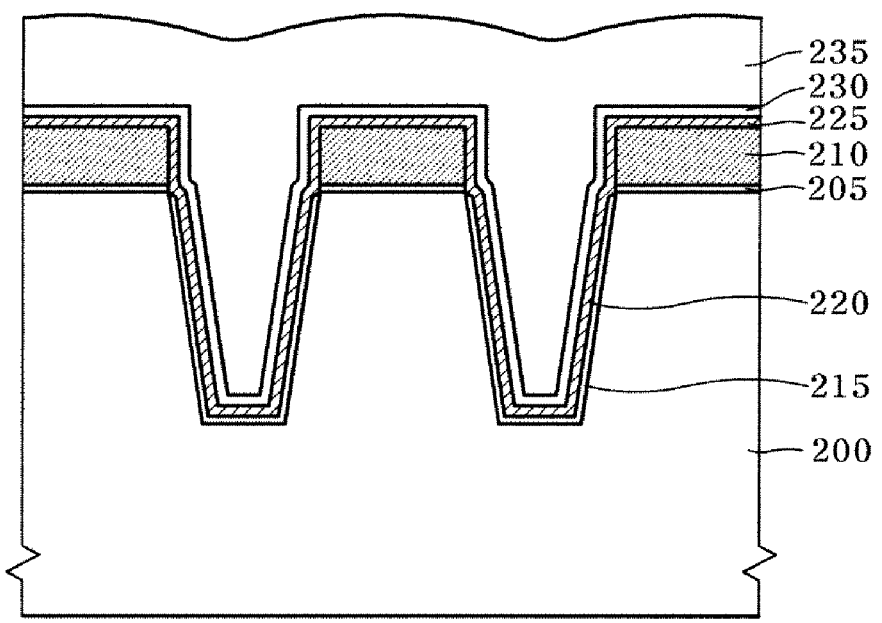
Figure 6:
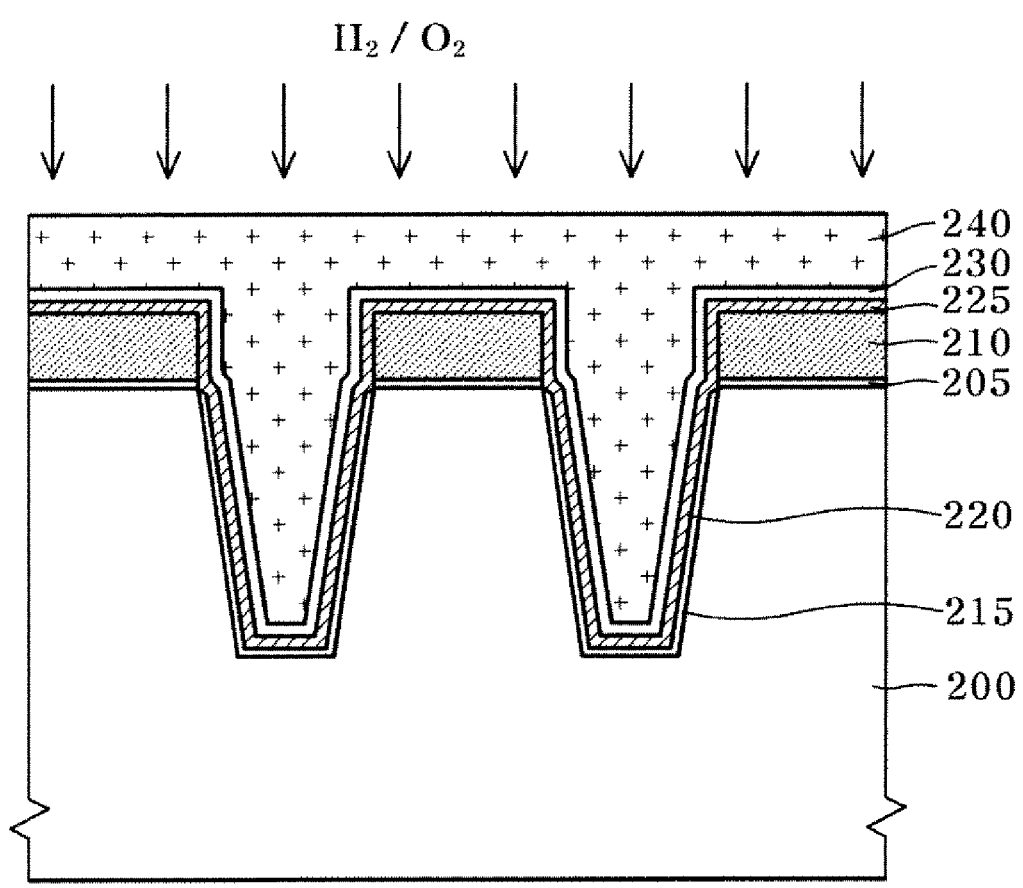
Figure 7:
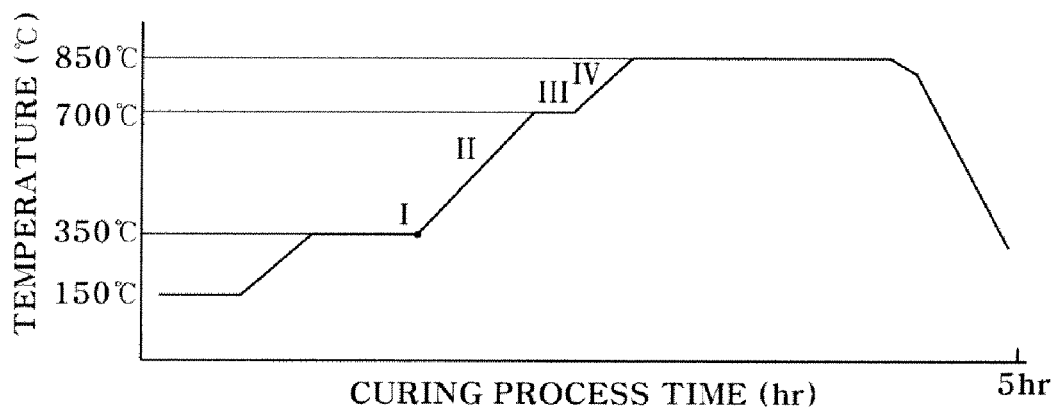
Figure 8:
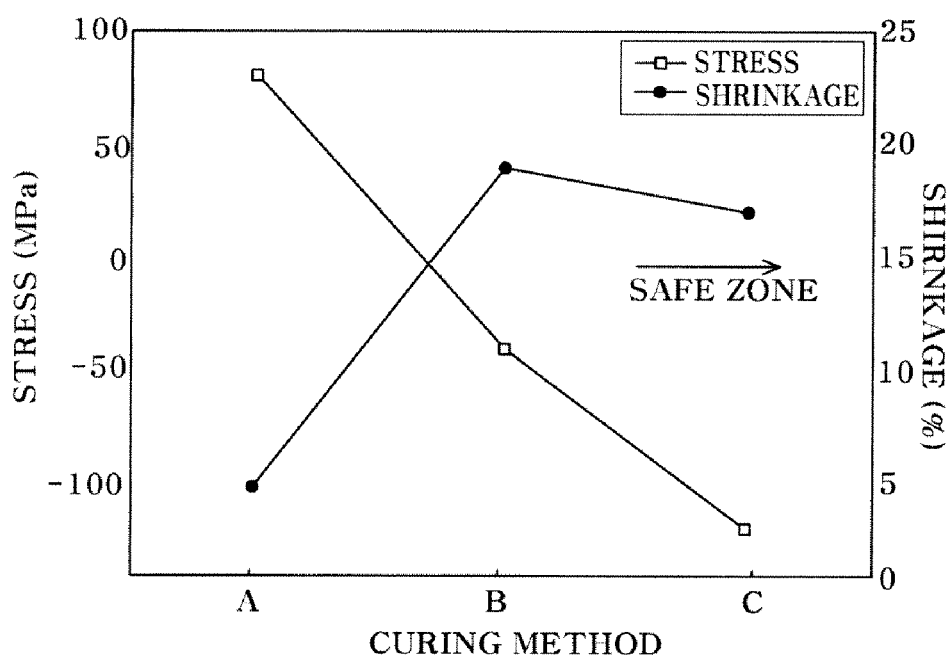

FIGS. 2 through 10 illustrate process steps for fabricating an insulation layer in a semiconductor device in accordance with an embodiment of the invention. FIG. 7 is a graph illustrating curing in accordance with an embodiment of the invention, and FIG. 8 is a graph illustrating trends in stress and shrinkage according to curing condition.

Figure 2:
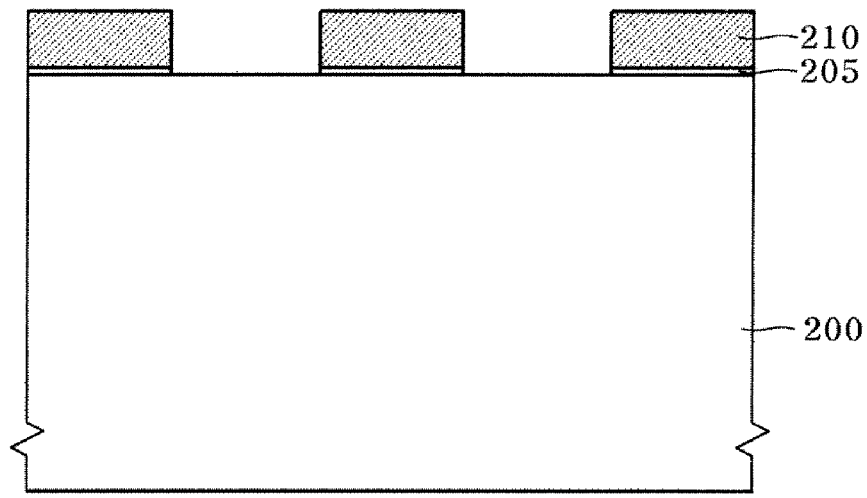
FIGS. 2 through 10 illustrate process steps for fabricating an insulation layer in a semiconductor device in accordance with an embodiment of the invention.

Referring to FIG. 2, a pad oxide pattern 205 and a pad nitride pattern 210 that define an isolation region are formed on a semiconductor substrate 200. Specifically, a pad oxide layer and a pad nitride layer are sequentially formed on the semiconductor substrate 200. The pad oxide layer preferably has a thickness in the range of 50 Å to 150 Å and the pad nitride layer preferably has a thickness in the range of 500 Å to 700 Å. Next, the pad oxide layer and the pad nitride layer are patterned to form the pad oxide pattern 205 and the pad nitride pattern 210 that expose a portion of the surface of the semiconductor substrate 200. The portion of the surface of the semiconductor substrate 200 exposed by the pad nitride pattern 210 and the pad oxide pattern 205 is defined as an isolation region by an isolation layer to be formed later, and the portion of the substrate surface covered with the pad nitride pattern 210 and the pad oxide pattern 205 is defined later as an active region.

Figure 3:
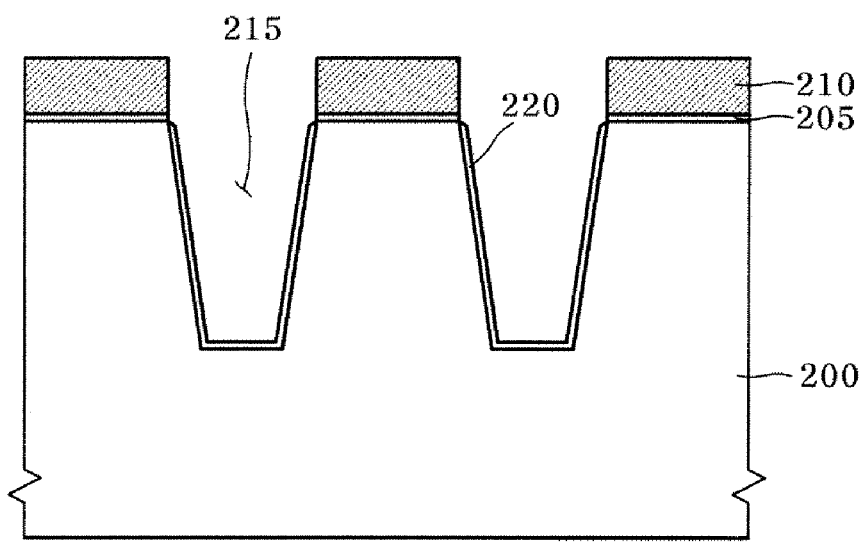

Referring to FIG. 3, the exposed region of the semiconductor substrate 200 is etched using the pad nitride pattern 210 and the pad oxide pattern 205 as an etch mask to form a trench 215 with a predetermined depth in the semiconductor substrate 200. The trench 215 preferably has a depth of 2000 Å to 3000 Å from the surface of the semiconductor substrate 200. Next, an oxidation process is implemented on the semiconductor substrate 200 to form a wall oxide layer 220 on an exposed face of the trench 215. The wall oxide layer 220 preferably has a thickness of 50 Å to 80 Å. The wall oxide layer 220 compensates for damage generated on the semiconductor substrate 200 during the formation of the trench with the etch process.

Figure 4:
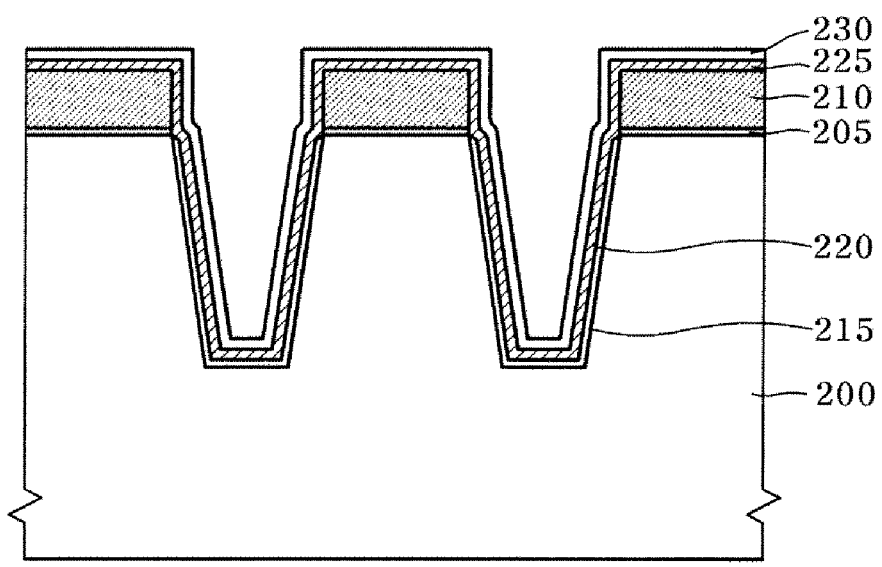

Referring to FIG. 4, a liner nitride layer 225 is formed extending along top and wall of the pad nitride pattern 210 and the wall oxide layer 220. Preferably, the liner nitride layer 225 is formed by an annealing process on the semiconductor substrate 200 formed with the wall oxide layer 220 under an atmosphere of ammonia ($NH_3$) gas, wherein a nitrification source is supplied and temperature preferably maintained in a range of 650° C. to 680° C. to deposit the liner nitride layer 225, preferably with a thickness of 50 Å to 80 Å.

The liner nitride layer 225 prevents leakage current caused by penetration of an oxidant source into the semiconductor substrate 200 during subsequent semiconductor fabrication processes, e.g., gate oxidation and thermal processes. Also, the liner nitride layer 225 prevents a phenomenon wherein impurities penetrate into the isolation layer during impurity implantation for formation of a channel, and a threshold voltage $V_{th}$ is thus reduced. The wall oxide layer 220 prevents stress generated when the liner nitride layer 220 is directly deposited on the semiconductor substrate 200. And, a liner oxide layer 230 is formed, preferably to a thickness of 50 Å to 80 Å along the exposed face of the liner nitride layer 225.

Referring to FIG. 5, a flowable insulation layer 235 is coated on the semiconductor substrate 200 to fill the trench 215.

Preferably, the flowable insulation layer 235 is coated on the semiconductor substrate 200 by placing the semiconductor substrate 200 on a spin coater. Next, a composition comprising mixed solvent and solute is coated on the semiconductor substrate 200 while rotating on the spin coater, to fill the trench 215. Preferably, the composition forming the flowable insulation layer 235 is a spin on dielectric (SOD) material, e.g. polysilazane layer, having excellent reflow properties. Preferably, the flowable insulation layer 235 is coated to a thickness of 4000 Å to 6000 Å to completely fill the trench with a depth of 2000 Å to 3000 Å. In this case, the trench 215 can be completely filled with a single layer of the flowable insulation layer 235 or can be filled with a dual layer of the flowable insulation layer 235 and an HDP oxide layer, in which some of the trench 235 is filled with the flowable insulation layer 235 and the rest of the trench 235 is filled with the HDP oxide layer.

Referring to FIG. 6, a curing process using continuous heating is implemented on the flowable insulation layer (235, see FIG. 5) to substitute the flowable insulation layer 235 with a silicon oxide ($SiO_2$) layer 240 (i.e., the flowable insulation layer 235 is converted to a silicon oxide layer by heating).

Figure 1A:
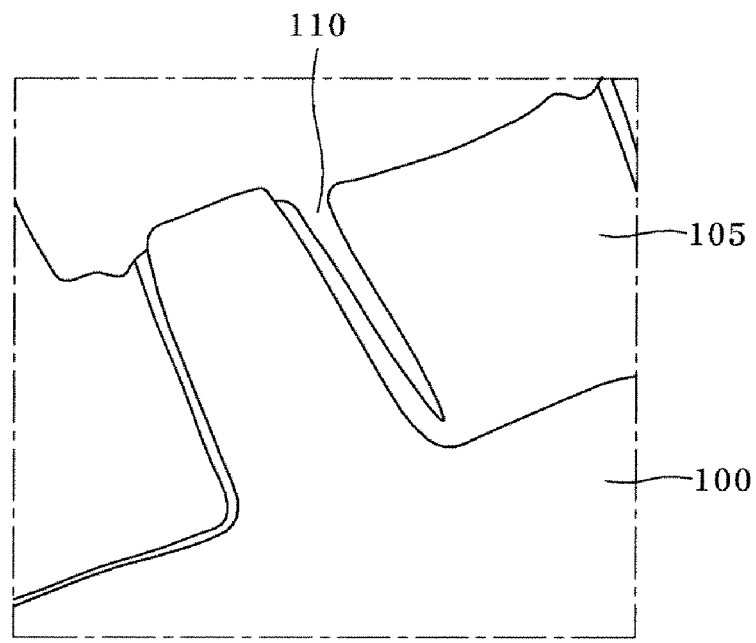
FIGS. 1A and 1B illustrate the problems generated when filling a trench with a flowable insulation layer.

When filling the trench 215 with the flowable insulation layer 235, various defects are generated according to variations in stress applied onto the flowable insulation layer 235 or in the shrinkage level of the flowable insulation layer 235, and it is thus difficult to form a high quality isolation layer. For example, variations in the stress are generated on the flowable insulation layer according to the level of curing and when the stress approaches a tensile stress of the flowable insulation layer, as illustrated in FIG. 1A, a defect of delamination or crack 110 is generated on the flowable insulation layer. When the curing process is implemented at a low temperature of 350° C. or less or at a high temperature of 850° C. or more, rapid variation in the stress is applied to the layer bonded with a tensile stress just after the curing process by exposure to a subsequent high temperature process. The rapid stress variation applied on the flowable insulation layer results in delamination or crack. Accordingly, to improve the defect such as delamination or crack of the flowable insulation layer, the curing process should be converted into a high compressive stress manner and, to this end, a high temperature process of 800° C. or more is required.

Figure 1B:
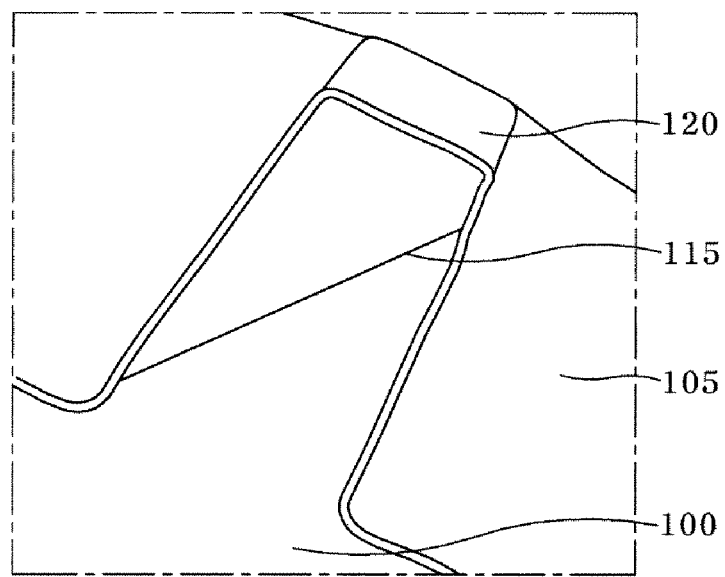

Another defect generated in a subsequent process after coating the flowable insulation layer includes slip and dislocation 115 as illustrated in FIG. 1B. The slip and dislocation is related to shrinkage caused in the curing process. The slip and dislocation are generated when a shrinkage level between the flowable insulation layer just after the coating and the flowable insulation layer after the curing process is 20% or more. Implementing the high temperature curing process on the flowable insulation layer instead of the low temperature curing process at 350° C. is the cause of increase of 20% or more in the shrinkage level between before and after the curing process. Accordingly, implementing low temperature curing and high temperature curing together lowers the shrinkage to a predetermined level.

Thus, the high temperature curing process stabilizes stress variation applied on the flowable insulation layer and the low temperature curing and the high temperature curing together control the shrinkage. Therefore, since the stress and the shrinkage property of the flowable insulation are in a trade-off relationship, a curing method capable of meeting the two properties desired. To this end, a method of repeatedly implementing the low temperature curing process and the high temperature curing process is developed, but this method is not suitable in mass production since it has complex process steps and requires a long time.

In an embodiment of the invention, a curing process using continuous heating prevents delamination, crack, slip, and dislocation of the flowable insulation layer by controlling the stress variation and shrinkage properties of the flowable insulation layer.

Specifically, the semiconductor substrate 200 formed with the flowable insulation layer 235 is placed in a curing apparatus. Referring next to FIG. 6 and to FIG. 7, the latter of which is a graph illustrating curing using continuous heating, a first curing step (I) optionally but preferably is implemented for 25 minutes to 45 minutes, highly preferably 30 minutes, preferably at a wet fraction of 12% to 16%, highly preferably 14%, preferably at a low temperature of 300° C. to 400° C., preferably with a pressure preferably maintained at 350 Torr to 450 Torr. To this end, hydrogen ($H_2$) gas and oxygen ($O_2$) gas preferably are supplied to a catalyst water vapor generator to generate moisture ($H_2O$). The catalyst water vapor generator is a device for generating moisture by supplying the hydrogen gas and the oxygen gas to a reaction chamber wherein a solvent contains platinum (Pt). When supplying the hydrogen gas and the oxygen gas onto the platinum-containing solvent, the platinum catalytically promotes bonding of hydrogen and oxygen to generate the moisture. The moisture generated as such moves to the curing apparatus and functions as an oxidant source.

Preferably, the hydrogen ($H_2$) gas and the oxygen ($O_2$) gas are supplied to the curing apparatus through the catalyst water vapor generator at respective relative amounts of 1 liter to 3 liters and 3 liters to 5 liters, highly preferably 2 liters and 4 liters, respectively, in order to maintain the wet fraction in 12% to 16%. Together with the moisture generated using the catalyst water vapor generator, oxygen gas is additionally supplied directly to the curing apparatus without passing through the catalyst water vapor generator, preferably in a relative amount of 8 liters to 12 liters, highly preferably 10 liters. Herein, the "wet fraction" is the ratio of the moisture ($H_2O$) to the total amount of gases supplied to the curing apparatus, and can be expressed by the following mathematical equation:

Wet fraction(%)=(amount of moisture($H_2O$)/total amount of supplied gases)×100

This optional first curing step (I) is implemented to control the shrinkage of the flowable insulation layer 235, preferably for 25 minutes to 35 minutes, more preferably for 30 minutes.

Next, a second curing step (II) that continuously increases the temperature in the curing process is implemented. In the second curing step (II), the temperature in the curing apparatus is continuously raised to 650° C. to 750° C., preferably while maintaining the pressure and wet fraction at 350 Torr to 450 Torr and 12% to 16%, respectively, which are the same as in the first curing step (I). Successively, a third curing step (III) that stabilizes the curing process is optionally implemented. The third curing step (III) preferably is implemented for 5 minutes to 15 minutes, highly preferably 10 minutes, and preferably at a temperature of 650° C. to 750° C., preferably while maintaining the pressure and wet fraction at 350 Torr to 450 Torr and 12% to 16%, respectively, which are the same as in the first curing step (I). The third curing step (III) stabilizes the flowable insulation layer 235, which has been subjected to the previous first curing step (I) and second curing step (II). Next, a fourth curing step (IV) that again raises the temperature in the curing process is implemented. In the fourth curing step (II), the temperature in the curing apparatus is continuously raised to 830° C. to 1100° C., preferably while maintaining the pressure and wet fraction at 350 Torr to 450 Torr and 12% to 16%, respectively, which are the same as in the first curing step (I). A fifth curing step (V) that stabilizes the curing process is implemented to complete the curing process using the continuous heating. The fifth curing step (V) preferably is implemented for 50 minutes to 70 minutes, highly preferably 60 minutes, preferably at a temperature of 830° C. to 1100° C. preferably at a wet fraction of 35% to 45%%, preferably while maintaining the pressure at 350 Torr to 400 Torr. By implementing the first through fifth curing steps (I) through (V), the flowable insulation layer is substituted with the silicon oxide layer 240. Also, when implementing the first through fifth curing steps (I) through (V) in accordance with an embodiment of the invention, the shrinkage of the flowable insulation layer is found to be less than 20% (e.g., 17%) and the flowable insulation layer is substituted with a silicon oxide layer having a compressive stress of −60 MPa.

Referring to FIG. 8, which is a graph illustrating trends in stress and shrinkage according to curing conditions, the stress and the shrinkage are shown to have a trade-off relationship according to the curing conditions. Specifically, in a condition 'A' in which the curing is implemented in a single process at only a low temperature of 350° C., the flowable insulation layer is found to have a low shrinkage of 5% and a tensile stress of approximately 100 MPa. In contrast, in a case of a condition 'B' of a two-step process in which a high temperature process at 700° C. is added to the low temperature process at 350° C., it is shown that the stress is lowered to −50 MPa, a compressive stress, and the shrinkage is increased to approximately 20%.

Thus, the high temperature curing process realizes the stress to a high compressive stress property, and the low temperature curing process, when implemented together with the high temperature curing process, maintains the shrinkage in a level of 20% or less. In this case, the slip is generated when the shrinkage is over 20%, and delamination or crack in the flowable insulation layer is generated when a tensile stress is applied or a compressive stress has a value lower than an absolute value of 40 MPa. Accordingly, when the high temperature and low temperature curing processes are implemented together in multiple steps, it is possible to form a layer stable against slip and the delamination in the flowable insulation layer. With reference to a condition 'C' in which a curing process using the continuous heating according to the invention is implemented, it is shown that the flowable insulation layer has a tensile stress of −100 MPa or less and the shrinkage of 20% or less and it is accordingly possible to form a region safe against defect.

The curing process in accordance with an embodiment of the invention is configured, as illustrated in FIG. 7, in such a form that large parts of the first curing step (I) at a low temperature to control the shrinkage are minimized and this is compensated for in the second curing step (II) and fourth curing step (IV) in which the temperature is continuously raised. Thus, the low temperature curing process controls shrinkage. However, when employing the curing process using continuous heating in accordance with an embodiment of the invention, it is possible to control the shrinkage to 20% or less even though the low temperature curing process is not implemented or partially implemented according to a level of the high temperature curing process. Also, since the stress is controlled by implementing the curing process of the continuous heating together with the high temperature curing process, it is possible to ensure a high compressive stress property.

Specifically, in preferred embodiments, the first curing process may be implemented by varying the wet fraction in a range of 8% to 89% and varying the pressure from 100 Torr to 700 Torr according to the stress and shrinkage levels, rather than being implemented for 30 minutes at a temperature of 300° C. at a wet fraction of 12% to 16% while maintaining the pressure at 350 Torr to 400 Torr. Alternatively, the shrinkage may be controlled by continuous heating with omission of the first curing step (I) implemented at a low temperature of 350° C. Also, the second curing step (II) and fourth curing step (IV), in which the temperature is continuously raised may be implemented varying the wet fraction in a range of 8% to 89% and the pressure from 100 Torr to 700 Torr according to the stress and shrinkage levels. Also, the third curing step (III) may be omitted if necessary, and the fourth curing step (IV) implemented at a high temperature can be implemented at a temperature of 850° C. to 1100° C. while varying the wet fraction in a range of 8% to 89% and the pressure from 100 Torr to 700 Torr according to a desired stress level, to thereby obtain higher compressive stress.

The spin on dielectric is better substituted with an oxide layer as the amount of moisture ($H_2O$) supplied increases. This spin on dielectric reacts sensitively at a high temperature and thus shrinkage tends to be increased when the curing process is implemented directly at a high temperature. The shrinkage is large when the wet fraction is small and the shrinkage is small when the wet fraction is large. Accordingly, control can be implemented by examining the shrinkage level according to the wet fraction and adjusting the wet fraction when the stress is required to be controlled or shrinkage is required to be controlled.

For example, when the compressive stress is 200 MPa and the shrinkage is 22%, the flowable insulation layer is safe against a crack defect since compressive stress is 40 MPa or more but slip and dislocation can be generated since the shrinkage is over 20%. Accordingly, the shrinkage can become 19% when implementing the curing process with the wet fraction set to 50%. In this case, the shrinkage is examined after the implementation of the curing process, and when the shrinkage is higher than a desired shrinkage (17%), the wet fraction is adjusted again and subject to the curing process, thereby capable of meeting the shrinkage to the desired shrinkage of 17%.

Thus, by implementation of the curing process using continuous heating in accordance with an embodiment of the invention, it is possible to achieve a process capable of improving the defect of the flowable insulation layer as well as being suitable for mass production. Also, it is possible to ensure a high quality flowable insulation layer by introduction of continuous curing.

Figure 9:
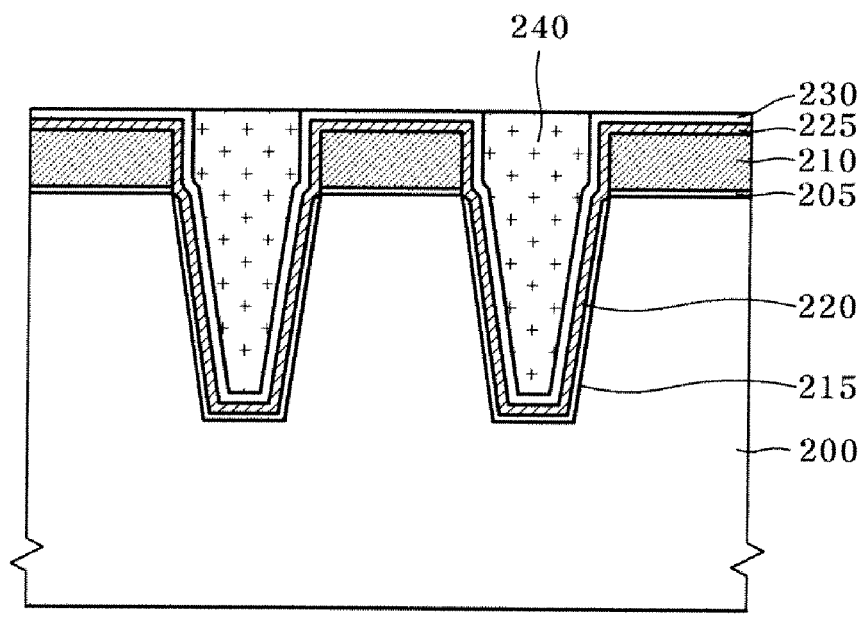

Referring to FIG. 9, a planarization process is implemented on the flowable insulation layer 240 on which the curing process has been implemented. The planarization process preferably is implemented by chemical mechanical polishing (CMP). This planarization process is implemented until a surface of the pad nitride pattern 210 is exposed. In this case, the liner nitride layer 225 can partially remain on the top of the pad nitride pattern 210.

Figure 10:
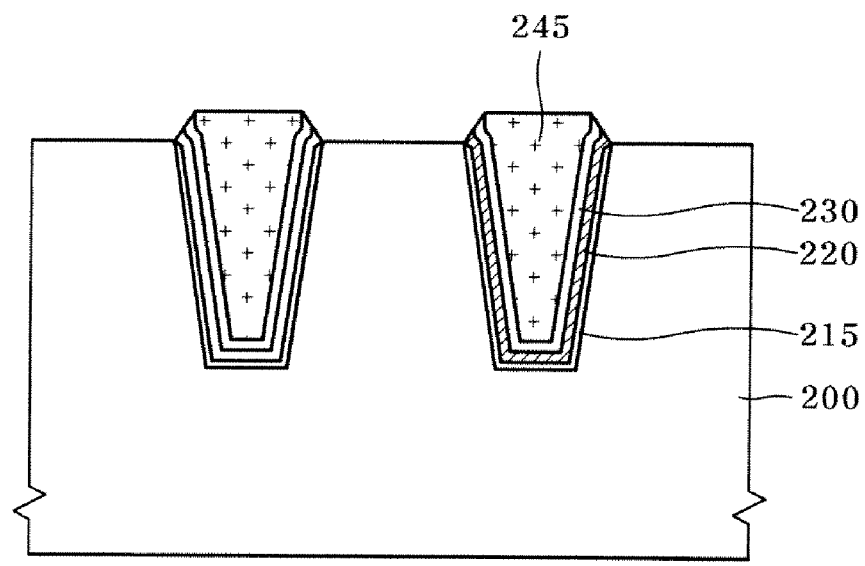

Referring to FIG. 10, the pad nitride pattern 210 and the pad oxide pattern 205 exposed by the planarization process are removed to form an isolation layer 245.

In accordance with an embodiment of the invention, it is possible to improve various defects generated in curing of the flowable insulation layer and thus achieve a high quality isolation layer. Also, with the curing process of the invention, it is possible to achieve an isolation layer capable of stable device properties.

In accordance with the curing process of the invention, it is possible to control the shrinkage that has an influence on the quality of the flowable insulation layer even when the low temperature curing process is not employed or partially implemented according to the level of the high temperature curing process. Furthermore, with the curing process of the invention, it is possible to ensure high compressive stress properties.

While the invention has been described with respect to the specific embodiments, various changes and modifications may be made without departing from the spirit and scope of the invention as defined in the following claims.

What is claimed is:

1. A method for fabricating an isolation layer in a semiconductor device, comprising:
   forming a trench in a semiconductor substrate;
   forming a flowable insulation layer on the trench and the semiconductor substrate;
   placing the semiconductor substrate formed with the flowable insulation layer in a curing apparatus;
   optionally implementing a first curing step comprising heating at a low temperature of 300° C. to 400° C. while supplying an oxidant source on the flowable insulation layer to control shrinkage of the flowable insulation layer;
   implementing a second curing step comprising continuously raising the temperature in the curing apparatus to an increased temperature in the range of 650° C. to 700° C.;
   optionally implementing a third curing step comprising maintaining the temperature in the curing apparatus at a temperature in the range of 650° C. to 750° C. for a predetermined time to stabilize the flowable insulation layer;
   implementing a fourth curing step comprising continuously raising the temperature in the curing apparatus to a temperature in the range of 830° C. to 1100° C. to induce compressive stress; and implementing a fifth curing step comprising maintaining the temperature in the curing apparatus at a high temperature in the range of 830° C. to 1100° C. for 50 minutes to 70 minutes to convert the flowable insulation layer to a silicon oxide layer; and forming an isolation layer by planarizing the silicon oxide layer.

2. The method of claim 1, comprising supplying hydrogen ($H_2$) gas and oxygen ($O_2$) gas together to catalytically form water as the oxidant source in respective relative amounts of 1 liter to 3 liters and 3 liters to 5 liters, respectively, and separately supplying additional oxygen gas in a relative amount of 8 liters to 12 liters.

3. The method of claim 1, comprising implementing the first through fourth curing steps at a wet fraction of 12% to 16% while maintaining a pressure in a range of 350 Torr to 450 Torr.

4. The method of claim 1, comprising implementing the fifth curing step at a wet fraction of 35% to 45% while maintaining a pressure in a range of 350 Torr to 400 Torr.

5. The method of claim 1, comprising converting the flowable insulation layer to the silicon oxide layer so that the shrinkage of the flowable insulation layer is maintained at a level of 20% or less and the compressive stress has an absolute value of 40 MPa or more.

6. The method of claim 1, comprising implementing the first, second, and fourth curing steps with varying wet fractions in a range from 8% to 89% and pressures in a range of 100 Torr to 700 Torr.

7. The method of claim 1, comprising varying temperature, wet fraction, and pressure in the fourth curing process in respective ranges of 850° C. to 1100° C., 8% to 89%, and 100 Torr to 700 Torr, to adjust the compressive stress.

* * * * *